United States Patent
Portman et al.

(10) Patent No.: US 6,317,330 B1
(45) Date of Patent: Nov. 13, 2001

(54) PRINTED CIRCUIT BOARD ASSEMBLY

(75) Inventors: Roland F. Portman, Pleasanton; Edgar Jhay Gregorios, Tracy, both of CA (US)

(73) Assignee: BiTMICRO NETWORKS, Inc., Fremont, CA (US)

( * ) Notice: Subject to any disclaimer, the term of this patent is extended or adjusted under 35 U.S.C. 154(b) by 0 days.

(21) Appl. No.: 09/504,303

(22) Filed: Feb. 15, 2000

(51) Int. Cl.[7] ..................................................... H05K 7/14
(52) U.S. Cl. .................. 361/742; 361/736; 361/737; 361/790; 361/796; 361/804; 439/74; 257/723
(58) Field of Search .................................. 361/736, 737, 361/741, 742, 752, 756, 758, 785, 790, 796, 802–804; 439/69, 74, 76.1; 257/686, 723

(56) References Cited

U.S. PATENT DOCUMENTS

| | | | |
|---|---|---|---|
| 4,226,491 | * 10/1980 | Kazama et al. | 439/76.1 |
| 4,695,872 | * 9/1987 | Chatterjee | 257/723 |
| 4,733,461 | * 3/1988 | Nakano | 439/74 |
| 5,107,404 | * 4/1992 | Tam | 361/736 |
| 5,373,104 | * 12/1994 | Brauer | 361/742 |
| 5,499,164 | * 3/1996 | Hill-Lindsay et al. | 361/785 |
| 5,583,749 | * 12/1996 | Tredennick et al. | 361/790 |
| 5,644,277 | * 7/1997 | Gulick et al. | 361/790 |
| 5,856,915 | * 1/1999 | Weinberg | 361/790 |
| 5,864,463 | * 1/1999 | Tsukada et al. | 361/737 |

* cited by examiner

Primary Examiner—Jeffrey Gaffin
Assistant Examiner—John B. Vigushin
(74) Attorney, Agent, or Firm—Sawyer Law Group LLP (57) ABSTRACT

An improved printed circuit board assembly is disclosed. The printed circuit board assembly comprises a first plate, a second plate attachably coupled to the first plate, and at least one printed circuit board sandwiched between the first plate and the second plate, the at least one printed circuit board extending over the entire area of the first and second plate. By utilizing an assembly in accordance with the present invention, the available space on each of the plurality of printed circuit boards is maximized. By maximizing the available space, more electronic circuitry can be incorporated onto the board. Furthermore, the exterior spacer design together with interior spacer elements firmly secures each printed circuit board while maintaining a constant separation between each board. This facilitates the ability to stack more printed circuit boards, while maintaining the mechanical alignment and structural rigidity necessary for the stacking data connectors to function properly in the event the assembly is subjected to a sudden shock or vibration.

15 Claims, 6 Drawing Sheets

PRINTED CIRCUIT BOARD ASSEMBLY

CROSS REFERENCE TO RELATED APPLICATIONS

The present application is related to co-pending application Ser. No. 09/504,304, entitled "A Removable Visual Indication Structure For a Printed Circuit Board" filed on the same day and assigned to the same Assignee as the present application.

FIELD OF THE INVENTION

The present invention relates generally to computer components and specifically to an improved technique to assemble and stack printed circuit boards.

BACKGROUND OF THE INVENTION

Figure 1:
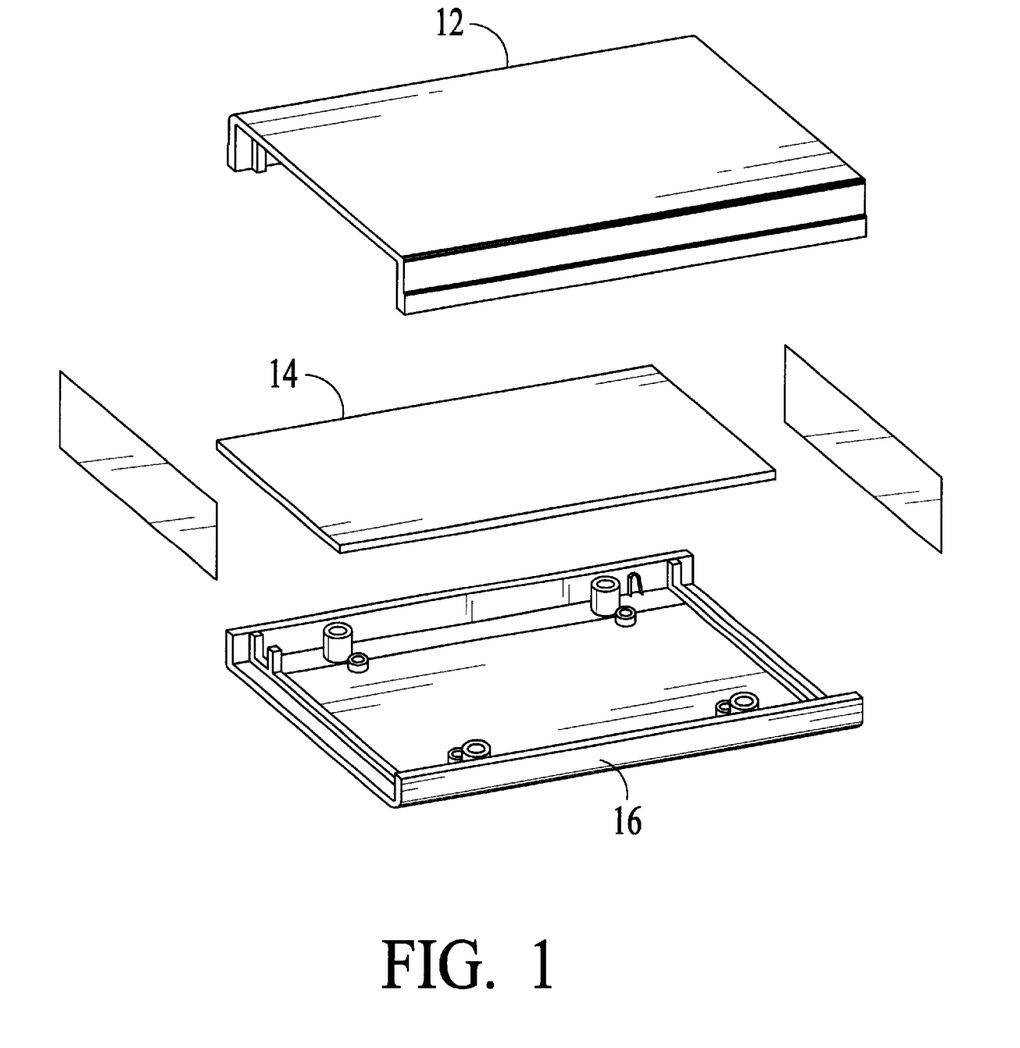
FIG. 1 is a conventional printed circuit board assembly.

Computer systems continually require more functionality, more memory and faster operational speeds, and in many cases they need it in smaller physical packages. Consequently to meet those requirements the packaging density of the Printed Circuit Boards (PCBs) of those computer systems increases accordingly. Additionally, there are many standard industry specifications that place additional dimensional constraints on the size of the PCBs as well as greatly increase tolerance to shock and vibration. FIG. 1 shows a conventional PCB assembly 10 comprising a cover plate 12 and a bottom plate 16. The PCB 14 is mounted in a chassis in between the cover plate 12 and the bottom plate 16.

While this type of conventional configuration is within standard industry requirements, it is not desirable for four reasons. First, it does not maximize the space available on the printed circuit board. The PCB is designed to fit inside the chassis with an air-gap separating the PCB and chassis, thus the usable area of the PCB is reduced. Second, the traditional design does not provide adequate support for PCBs which are subjected to high levels of shock and vibration. This lack of support contributes to an unstable PCB assembly. Third, the lack of adequate support limits the number of PCBs which can be stacked based on their relative instability. Fourth, it does not provide precise separation and alignment between the PCBs when the PCBs are joined together with a stacking data connector. This is of a significant concern since the mechanical stability of the assembly is crucial to maintaining electrical integrity of the stacking data connector.

Accordingly, what is needed is an assembly that deals with each of these concerns. The present invention addresses these needs.

SUMMARY OF THE INVENTION

An improved printed circuit board assembly is disclosed. The printed circuit board assembly comprises a first plate, a second plate attachably coupled to the first plate, and at least one printed circuit board sandwiched between the first plate and the second plate, the at least one printed circuit board extending over the entire area of the first and second plate.

By utilizing an assembly in accordance with the present invention, the available space on each of the plurality of printed circuit boards is maximized. By maximizing the available space, more electronic circuitry can be incorporated onto the board. Furthermore, the exterior spacer design together with interior spacer elements firmly secures each printed circuit board while maintaining a constant separation between each board. This facilitates the ability to stack more printed circuit boards, while maintaining the mechanical alignment and structural rigidity necessary for the stacking data connectors to function properly in the event the assembly is subjected to a sudden shock or vibration.

DETAILED DESCRIPTION

The present invention relates to a printed circuit board assembly. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The apparatus in accordance with the present invention is presented in the context of a preferred embodiment. The preferred embodiment of the present invention is an improved printed circuit board assembly. The printed circuit board assembly in accordance with the present invention incorporates printed circuit boards that extend over the entire area of the bottom plate. By extending the printed circuit board over the entire area of the bottom plate, the available space on each of the printed circuit boards is maximized. By maximizing the available space, more electronic circuitry can be incorporated onto the board. Furthermore, the exterior spacer design together with interior spacer elements firmly secures each printed circuit board while maintaining a constant separation between each board. This facilitates the ability to stack more printed circuit boards, while maintaining the mechanical alignment and structural rigidity necessary for the stacking data connectors to function properly in the event the assembly is subjected to a sudden shock or vibration.

Figure 2:
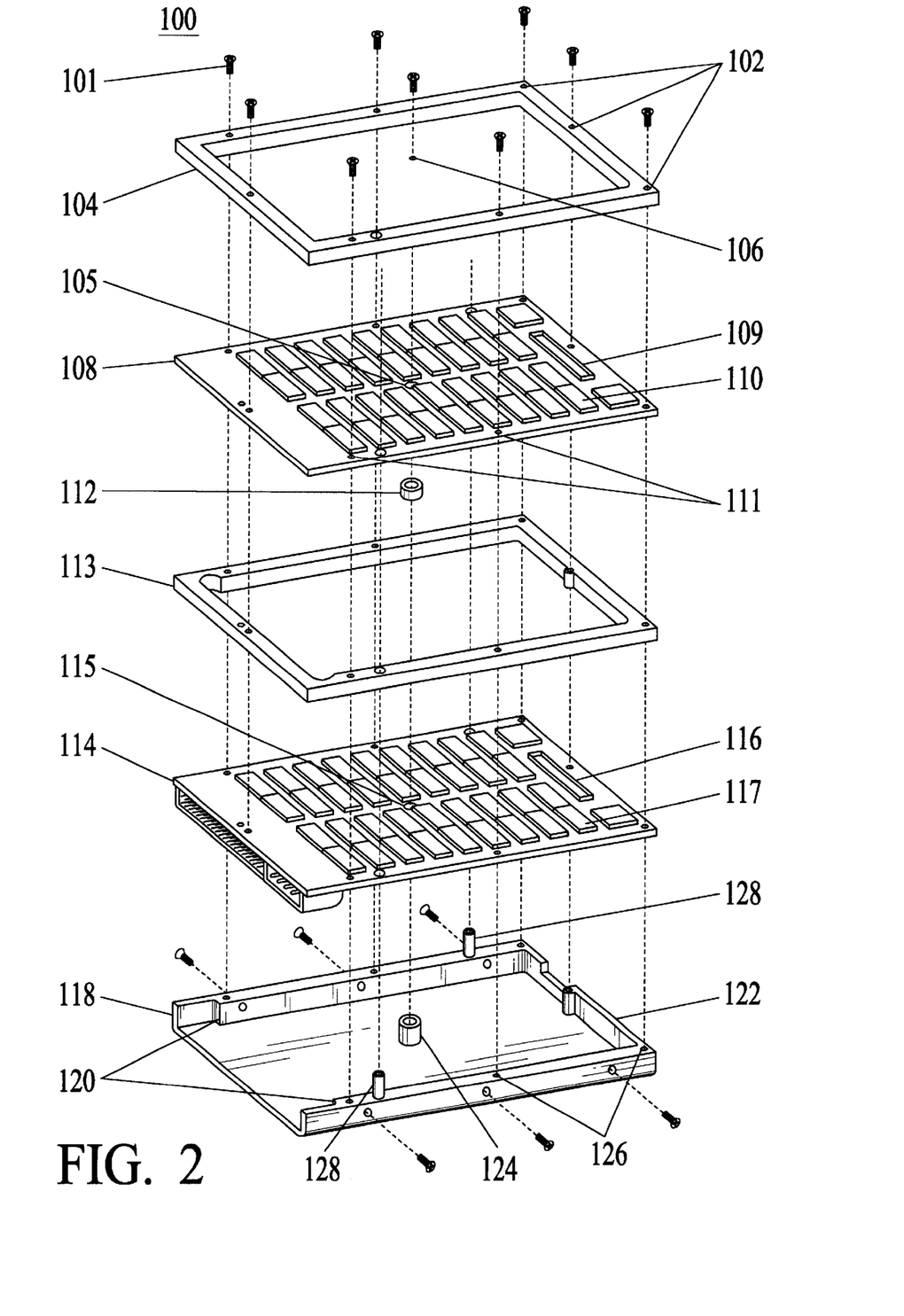
FIG. 2 shows a printed circuit board assembly in accordance with the present invention.

For a better understanding of the assembly in accordance with the present invention, please refer now to FIG. 2. FIG. 2 shows a printed circuit board (PCB) assembly 100 in accordance with the present invention. The assembly 100 includes a cover plate 104, a memory board 108, a perimeter spacer element 113, a controller board 114, and a bottom plate 118.

The cover plate 104, bottom plate 118 and perimeter spacer element 113 are preferably made of a hard anodized aluminum for rigidity, appearance, durability, and to prevent corrosion. However, the aluminum could be replaced if a suitable substitute was found which met the mechanical requirements. The cover plate 104 further includes a plurality of perimeter mounting holes 102 and a center mounting hole 106. Once the memory board 108, the perimeter spacer element 113, the controller board 114, and the bottom plate 118 are stackably in place, the cover plate 104 is coupled to the bottom plate 118 via threaded fasteners 101 or similar connection means that arc fitted into the center hole 106 and each of the perimeter mounting holes 102.

Figure 3:
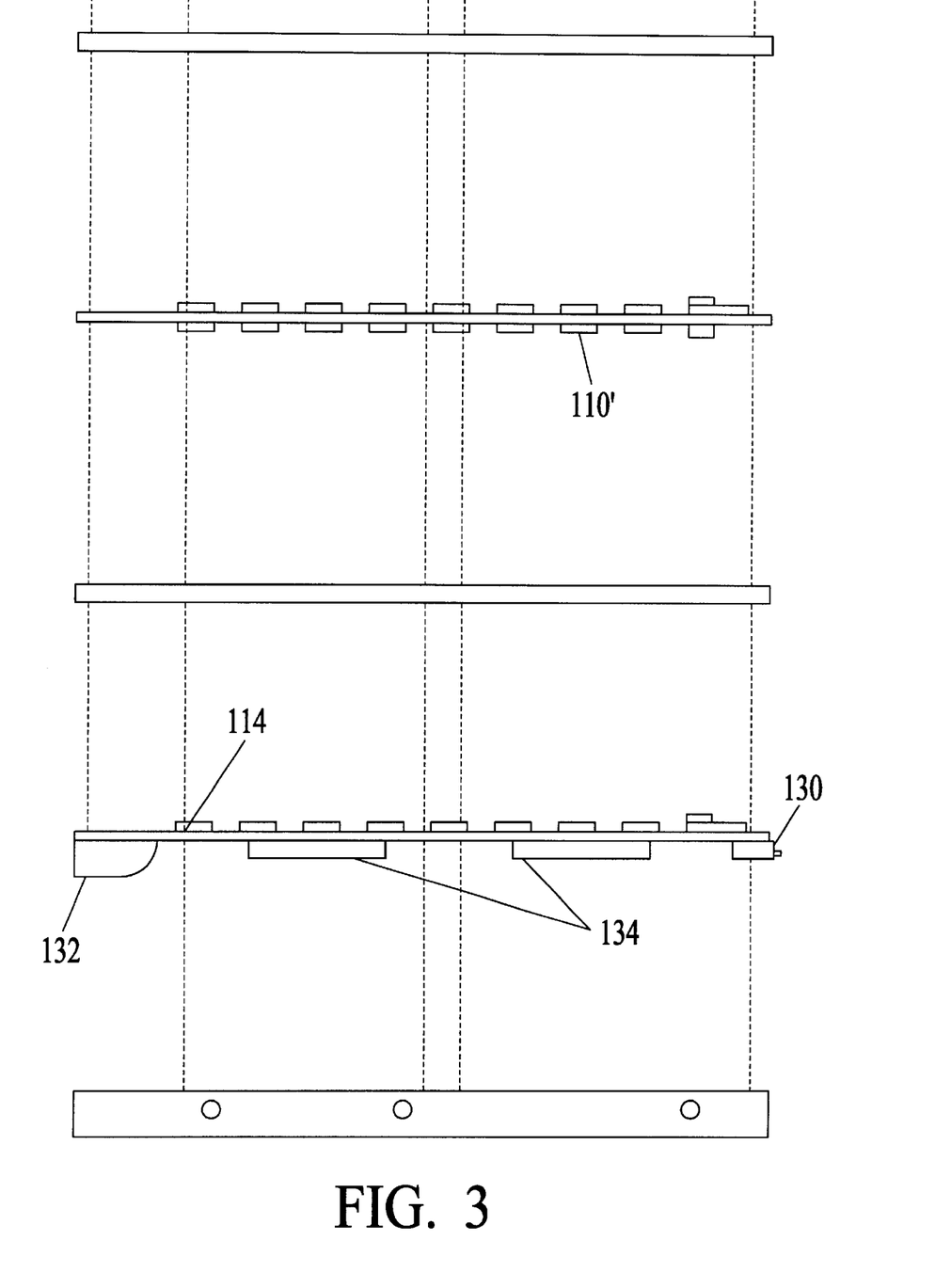
FIG. 3 is a side view of the assembly in accordance with the present invention.

The memory board 108 includes a connector element 109, a plurality of memory chips 110, perimeter holes 111, and a center hole 105. Please refer now to FIG. 3. Shown in FIG. 3 is a second plurality of memory chips 110' that are located on the other side of the memory board 108. The connector element 109 is utilized to interconnect the memory board 108 with the controller board 114 via a second connector element 116. Each of the connector elements 109, 116 are preferably header/socket type connector elements.

Referring back to FIG. 2, located between the memory board 108 and the controller board 114 is the perimeter spacer element 113. Preferably, the perimeter spacer element 113 has a height of 3 mm and is implemented to rigidly support the connection between the memory board 108 and the controller board 114 while maintaining an optimum distance between the memory board 108 and the controller board 114. This becomes important if the PCB assembly is subjected to a sudden shock or vibration. If the connector elements 109, 116 are subjected to any vibrational forces while data is being transferred and the connection between the boards is temporarily misaligned, data integrity could be affected. The perimeter spacer element 113 also prevents the memory chips 110' from touching the memory chips 117 on the controller board 114. Accordingly, since the memory chips arc approximately 1.1 mm thick, the 3 mm perimeter spacer element 113 provides a distance of approximately 0.8 mm no between the chips.

Although the preferred embodiment of the present invention discloses specific component dimensions, one of ordinary skill in the art will readily recognize that a variety of dimensions could be utilized while remaining within the spirit and scope of the present invention.

Also shown in FIG. 2 is a center spacer ring 112 that is preferably located between each of the PCBs at the center hole 115 of the controller board 114. This center spacer ring 112 is preferably made of the same material and is the same height as the perimeter spacer 113. This is due to the thermal coefficient of expansion, i.e., it will expand/contract in size at the same rate as the perimeter spacer 113. The center spacer ring 112 should be of a sufficient thickness to Support a threaded fastener or similar connections means and is included to add stability to the center of PCB assembly 100 should the PCB assembly 100 be subjected to a sudden shock or vibration. The center spacer ring 112 is subsequently held in place by a 110 threaded fastener or similar connection means that is fitted from the center hole 106 of the cover plate 104 to the threaded riser 124 of the bottom plate 118. The center spacer ring 112 is not threaded, however the threaded fastener passes easily through it.

The controller board 114 includes a plurality of memory chips 117, a plurality of perimeter holes 119, a center hole 115, and a connector 116. Please refer now to FIG. 3. The controller board 114 also includes an LED portion 130 and an interface connector 132. Located on the bottom side of the controller board 114 are the control components 134. These include, but are not limited to, processors, memory, interface chips, DC-DC converters, etc.

The bottom plate 118 includes two side walls 120, a back wall 122, and a threaded riser 124. Each of the side walls 120 and the back wall 122 are of a sufficient thickness to Support threaded fasteners or similar connections means and accordingly include a plurality of perimeter holes 126 for receiving the threaded fasteners. Also included on the bottom plate is a threaded riser 124. The threaded riser 124 is preferably machined into the bottom plate 118 and is located at the center of bottom plate 118. The riser 124, is the same height of the side walls 120 and is of a sufficient thickness to support a threaded fastener or similar connections means, is included to add stability to the center of PCB assembly should the PCB assembly be subjected to a sudden shock or vibration.

Figure 4:
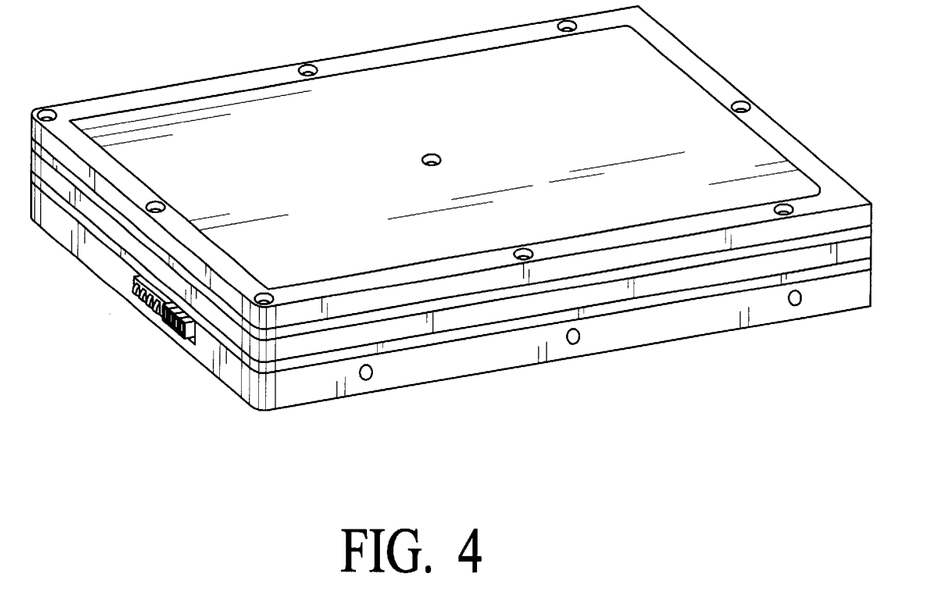
FIG. 4 is a view of the completely assembled printed circuit board assembly in accordance with the present invention.

Finally, the bottom plate 118 includes two dowel holes wherein two dowel pins 128 are pressed into the bottom plate 118 during assembly. These dowel pins 128 are preferably made of stainless steel or another suitable material. These dowel pins 128 are preferably located diametrically opposite each other on the side walls 120 of the bottom plate 118 and add to the structural rigidity of the PCB assembly 100. FIG. 4 is a view of the completely assembled printed circuit board assembly 100 in accordance with the present invention.

A key feature of the present invention involves the design of the printed circuit boards 108, 114. In accordance with the present invention. the PCBs 108, 114 are extended over the entire area of the bottom plate 118. Specifically, the PCBs 108, 114 are extended over the edges of the side walls 120 and back wall 122 of the bottom plate 118. By extending the PCBs 108,114 over the edges of the side walls 120 and back wall 122 of the bottom plate 118, the available space on each of the PCBs 108, 114 is increased, thereby allowing the memory chips to be placed further towards the side edges of the PCBs 108,114. Consequently, by allowing the memory chips to be placed further towards the side edges of the PCBs 108,114 the PCBs are able to incorporate more memory chips.

Accordingly, if the PCBs 104, 114 were designed using conventional PCB design methods, they could only employ a maximum of 28 memory chips on each side of the PCBs because of the limited available space. By extending the PCBs over the edges of the side walls and back wall of the bottom plate, a PCB in accordance with the present invention is capable of employing 32 memory chips on each side of the PCBs. Increasing the amount of memory chips utilized in the PCB assembly in accordance with the present invention produces the desirable affect of increasing the available memory capacity and as physical package of the memory chips decreases in size, the number of chips utilized in the assembly will increase as well.

Although the above described embodiment of the present invention contemplates increasing the number of memory chips on a PCB, it should be readily apparent to one of ordinary skill in the art that any type of electronic circuitry could be incorporated onto the PCB while remaining within the spirit and scope of the present invention.

Figure 5:
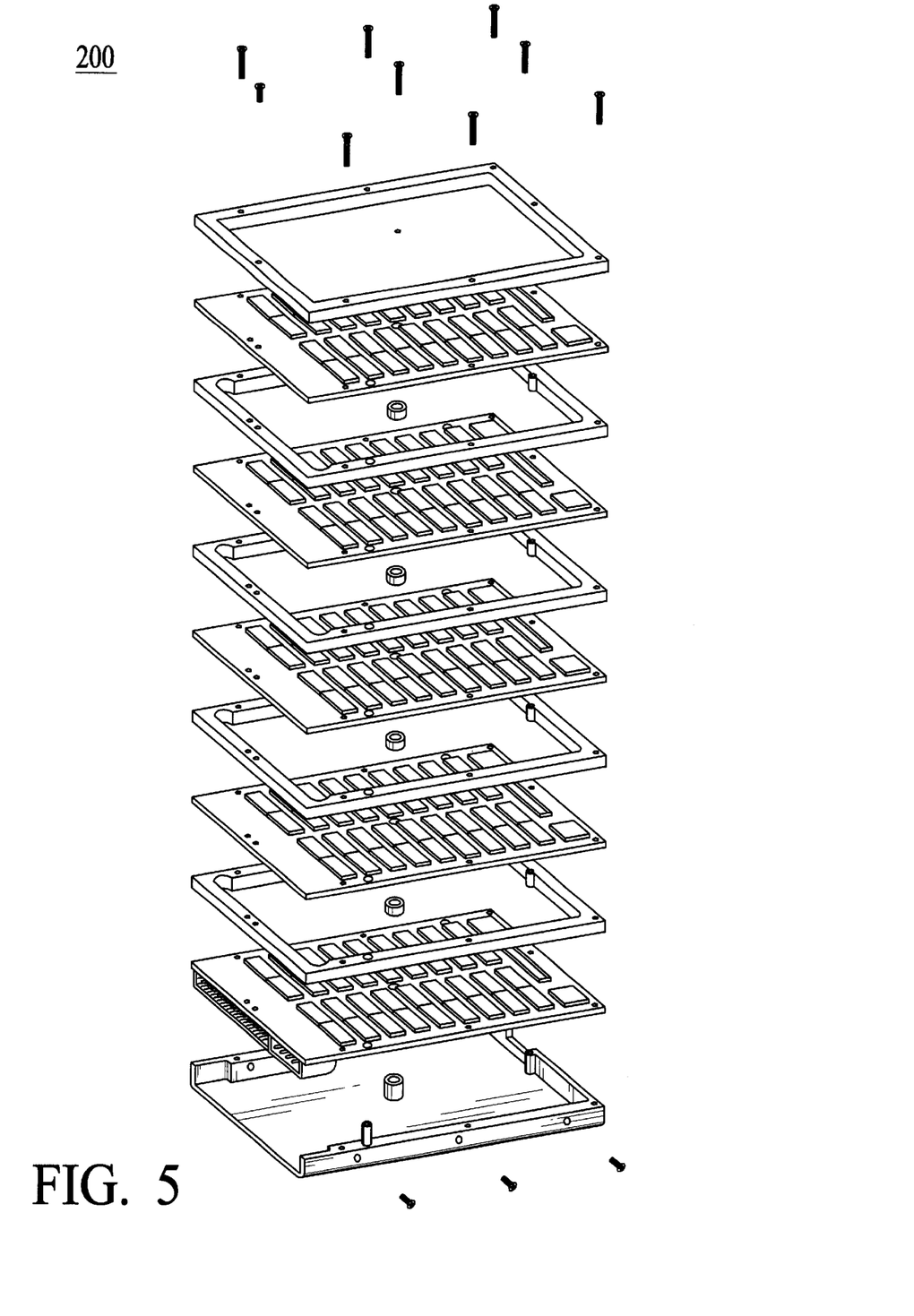
FIG. 5 shows a 5-board printed circuit board assembly in accordance with the present invention.
Figure 6:
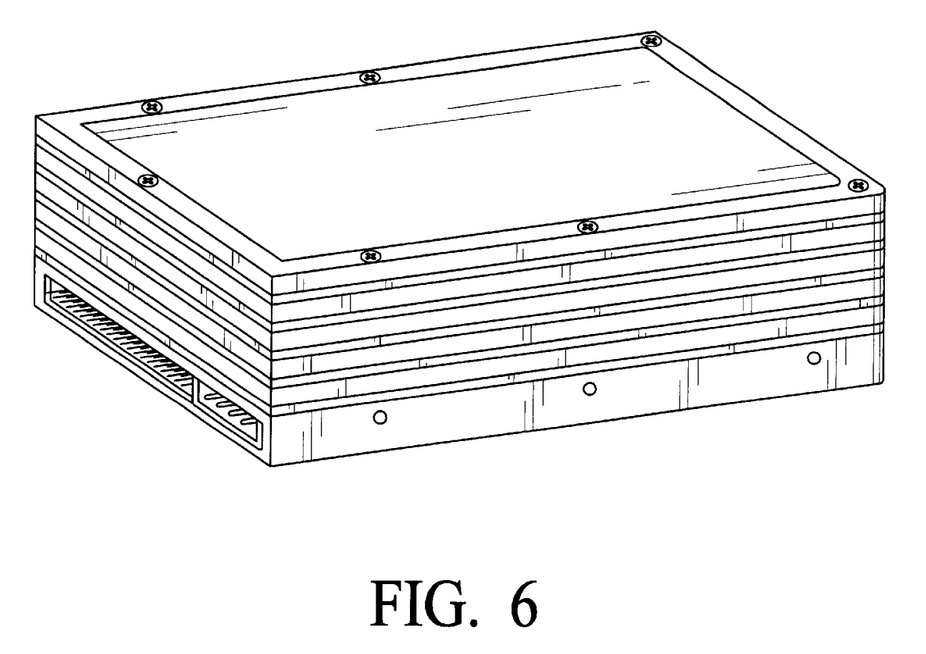
FIG. 6 is a view of a completely assembled 5-board printed circuit board assembly in accordance with the present invention.

A further aspect of extending the PCBs over the edges of the side walls and back wall of the bottom plate is the fact that the PCBs are subsequently mounted along the perimeter edges at the perimeter mounting holes. By mounting the PCBs along their respective perimeters, the stability of the individual PCBs is increased which increases the overall stability of the PCB assembly. One of the main objectives of the present invention is to provide a PCB assembly that can stackably house as many PCBs as possible while maintaining a structurally rigid assembly. By extending the PCBs over the edges of the side walls and back wall of the bottom plate and by utilizing thinner PCBs in conjunction with the spacer elements (spacer assembly, center spacer) the PCB assembly in accordance with the present invention is capable of stacking numerous PCBs in a structurally rigid fashion. For example, FIGS. 5 and 6 respectively show a 5-board PCB assembly 200 in accordance with the present invention and a view of the completely assembled 5-board PCB assembly 200 in accordance with the present invention.

Although the above described embodiment of the present invention discloses the ability to stack up to 5 PCBs in one PCB assembly, one of ordinary skill in the art should readily recognize that the preferred embodiment of the present invention should not be limited to 5 boards. As many as 10 PCBs may be stacked in one PCB assembly and as computer components become smaller, this number may increase. Accordingly, the maximum number of PCBs utilized in a PCB assembly in accordance with the present invention could vary while remaining within the spirit and scope of the present invention.

Additionally, for manufacturers that are especially concerned with protecting the PCB assembly against a sudden shock or vibration, an added component is contemplated. This component is a vibration dampener, preferably made of an elastomer material, that could be fitted on top of a memory chip. Consequently, each PCB in accordance with the present invention could incorporate a plurality of vibration dampeners that are fitted on the tops of a portion of the memory chips in order to provide added support to the PCB assembly. Preferably, the dampeners are pre-loaded 20%–40% in order to achieve maximum effectiveness. For instance, if the distance between the memory chips on a top layer of a PCB and the memory chips on the bottom layer of the PCB directly above it is 0.8 mm, a 1 mm thick dampener that is fitted on the top of one of the chips would be compressed (pre-loaded) by 0.2 mm or 20%.

By utilizing an assembly in accordance with the present invention, the available space on each of the plurality of printed circuit boards is maximized. By maximizing the available space, more electronic circuitry can be incorporated onto the board. Furthermore, the exterior spacer design together with interior spacer elements firmly secures each printed circuit board while maintaining a constant separation between each board. This facilitates the ability to stack more printed circuit boards, while maintaining the mechanical alignment and structural rigidity necessary for the stacking data connectors to function properly in the event the assembly is subjected to a sudden shock or vibration.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A printed circuit board assembly comprising:
   a first plate;
   a second plate attachably coupled to the first plate; and
   at least one printed circuit board sandwiched between the first plate and the second plate, the at least one printed circuit board extending over the entire area of the first and second plate;
   wherein the at least one printed circuit board comprises a controller board and at least one memory board, the controller board and at least one memory board having a connector element for connecting the controller board to the at least one memory board, the controller board having a first and second side wherein the first side comprises a plurality of memory chips thereon and the second side comprises a plurality of control components thereon, the at least one memory board having a first and second side, each of the first and second sides having a plurality of memory chips thereon.

2. The assembly of claim 1 further comprising a perimeter spacer element wherein the perimeter spacer element is sandwiched between the controller board and the at least one memory board.

3. The assembly of claim 2 wherein each of the controller board and the at least one memory board further includes a center mounting hole, the assembly further comprising a center spacer element located between the controller board and the at least one memory board at the center mounting hole.

4. The assembly of claim 1 further comprising a dampener element substantially compressed between the controller board and the at least one memory board.

5. The assembly of claim 4 wherein the dampener element comprises an elastomer material.

6. The assembly of claim 1 wherein the at least one memory board comprises a plurality of memory boards, each of the plurality of memory boards having a first and second side, each of the first and second sides having a plurality of memory chips thereon, wherein each of the plurality of memory boards includes a connector element for connecting each of the plurality of memory boards to the controller board, wherein each of the printed circuit boards is separated by a perimeter spacer element and a center spacer element.

7. The assembly of claim 6 wherein the at least one memory board comprises at least 9 memory boards.

8. The assembly of claim 1 wherein the first plate comprises a cover plate and the second plate comprises a bottom plate.

9. A printed circuit board assembly comprising:
   a first plate;
   a second plate attachably coupled to the first plate;
   a plurality of printed circuit boards sandwiched between the first plate and the second plate, each of the plurality of printed circuit boards extending over the entire area of the first and second plate, wherein the plurality of printed circuit boards comprises a controller board and at least one memory board the controller board and at least one memory board having a connector element for connecting the controller board to the at least one memory board the controller board having a first and second side wherein the first side comprises a plurality of memory chips thereon and the second side comprises a plurality of control components thereon, the at least one memory board having a first and second side, each of the first and second sides having a plurality of memory chips there on; and
   at least one perimeter spacer element wherein the at least one perimeter spacer element is sandwiched between each of the plurality of printed circuit boards.

10. The assembly of claim 9 wherein each of the plurality of printed circuit boards further includes a center mounting holes the assembly further comprising a center spacer element located between each of the plurality of printed circuit boards at the center mounting hole.

11. The assembly of claim 10 further comprising a dampener element substantially compressed between each of the plurality of printed circuit boards.

12. The assembly of claim 11 wherein the dampener element comprises an elastomer material.

13. The assembly of claim 12 wherein the at least one memory board comprises at least 9 memory boards.

14. The assembly of claim 9 wherein the first plate comprises a cover plate and the second plate comprises a bottom plate.

15. A printed circuit board assembly comprising:

a cover plate;

a bottom plate attachably coupled to the cover plate;

a plurality of printed circuit boards sandwiched between the cover plate and the bottom plate, each of the plurality of printed circuit boards extending over the entire area of the cover plate and the bottom plate, each of the plurality of printed circuit boards including a center mounting hole and a connector element for connecting the plurality of printed circuit boards, the plurality of printed circuit boards comprising at least one controller board and 9 memory boards, the controller board having a first and second side wherein the first side comprises a plurality of memory chips thereon and the second side comprises a plurality of control components thereon, each of the 9 memory boards having a first and second side, each of the first and second sides having a plurality of memory chips thereon;

a plurality of perimeter spacer elements wherein each of the plurality of perimeter spacer elements is sandwiched between each of the plurality of printed circuit boards;

a plurality of center spacer elements, each of the plurality of center spacer elements located between each of the plurality of printed circuit boards at the center mounting hole; and an elastomer material substantially compressed between each of the plurality of printed circuit boards.

* * * * *